United States Patent
You

(10) Patent No.: US 10,115,478 B2
(45) Date of Patent: Oct. 30, 2018

(54) SEMICONDUCTOR MEMORY DEVICE

(71) Applicant: SK hynix Inc., Gyeonggi-do (KR)

(72) Inventor: Jung-Taek You, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 201 days.

(21) Appl. No.: 15/209,077

(22) Filed: Jul. 13, 2016

(65) Prior Publication Data
US 2017/0256326 A1   Sep. 7, 2017

(30) Foreign Application Priority Data
Mar. 4, 2016   (KR) ........................ 10-2016-0026353

(51) Int. Cl.
G06F 11/00  (2006.01)
G11C 29/44  (2006.01)
G06F 11/07  (2006.01)

(52) U.S. Cl.
CPC ............ *G11C 29/44* (2013.01); *G06F 11/079* (2013.01); *G06F 11/0727* (2013.01); *G06F 11/0751* (2013.01); *G06F 11/0793* (2013.01)

(58) Field of Classification Search
CPC ............ G06F 11/1666; G06F 11/1068; G06F 11/1088; G06F 11/16; G06F 11/2094; G06F 11/2084; G11B 20/1883; G11C 29/838; G11C 29/70

USPC ................................ 714/6.1, 6.12, 6.13, 6.2
See application file for complete search history.

(56) References Cited

U.S. PATENT DOCUMENTS

2007/0030746 A1*  2/2007  Best ...................... G11C 11/406
                                                          365/222
2015/0287480 A1* 10/2015  Wilson .................. G11C 29/70
                                                          365/96

FOREIGN PATENT DOCUMENTS

KR       1020150092451      8/2015

* cited by examiner

Primary Examiner — Sarai E Butler
(74) Attorney, Agent, or Firm — IP & T Group LLP

(57) ABSTRACT

A semiconductor memory device includes: a plurality of memory cell arrays each memory cell array including a first region, a second region, and a third region in the second region; and a repair controller suitable for storing a first repair address information, generating a first mode enable signal for accessing the third region by comparing the first repair address information with a row address during a first mode for a repair operation, and disabling the first mode enable signal in response to a refresh command regardless of a result of the comparing the first repair address information with the row address.

20 Claims, 4 Drawing Sheets

SEMICONDUCTOR MEMORY DEVICE

CROSS-REFERENCE TO RELATED APPLICATIONS

The present application claims priority under 35 U.S.C § 119(a) to Korean Patent Application No. 10-2016-0026353, filed on Mar. 4, 2016, which is incorporated herein by reference in its entirety.

BACKGROUND

1. Field

Embodiments of the present invention relates generally to a semiconductor design technology and, more particularly, to a semiconductor memory device that is suitable for performing a repair operation.

2. Description of the Related Art

Semiconductor memory devices include a plurality of memory banks for storing data, and each of the memory banks includes more than tens of millions of memory cells. Each of the memory cells may include a capacitor for storing data in the form of a charge and a transistor for controlling the charging and discharging of the capacitor. Semiconductor memory devices store data in memory cells through the operations of charging or discharging the capacitors of the memory cells. Theoretically, cell capacitors maintain a constant amount of charges stored therein if there is no other voltage or current applied thereto. However, in actuality, the amount of charges stored in cell capacitors may change due to a voltage difference with a peripheral circuit. Such a voltage difference may cause charges to leak out of charged cell capacitors, or may make more charges to enter into the cell capacitors. A substantial change in the amount of charges in cell capacitors may signify that the data stored in the cell capacitors is changed, which means that the data stored in the cell capacitors is lost.

To prevent stored data from being lost, semiconductor memory devices perform a refresh operation.

As fabrication technology advances, the integration degree of semiconductor memory devices is Increasing more and more, which increases the number of memory cells to be refreshed as well. Therefore, a refresh operation is to be periodically performed on a plurality of memory cells at once. In a semiconductor memory device, a refresh operation is performed on a basis of memory blocks. A refresh operation may be performed simultaneously on a plurality of memory blocks, or may be performed on the memory blocks in a sequential manner with a predetermined temporal interval between each memory block refresh for reducing instant current consumption.

For example, when a refresh operation is performed in parallel on a plurality of memory cell array regions inside a semiconductor memory device, the refresh operation may be performed by dividing the memory cell array regions on a basis of memory blocks. In this case, since the refresh operation is to be performed on all the memory blocks in parallel, block selection signals for enabling the corresponding memory blocks may be enabled concurrently, or enabled with a slight temporal interval between them. Therefore, since the refresh operations performed on the memory blocks in parallel overlap each other, all the memory blocks may be enabled at the same time.

A memory block, which is a unit for a refresh operation, is divided into a normal cell region and a redundant cell region. The normal cell region may include memory cells for storing data and the redundant cell region may include memory cells for repairing defective cells of the normal cell region. An operation for repairing defective cells of the normal cell region is called a repair operation. When a refresh operation is performed on a defective cell, a redundant cell used for repairing the defective cell is to be refreshed. Thus, when the addresses of target memory cells to be refreshed for each memory block are inputted, it is decided whether the target memory cells are in the redundant cell region or in the normal cell region, and then the refresh operation is performed on the target memory cells of the corresponding regions.

Typically, a repair operation for defective memory cells includes a repair operation performed on the stage of wafer and a repair operation performed on the stage of package. The repair operation performed on the stage of package is called a post-package repair (PPR) operation.

A soft PPR (SPPR) mode, which is a kind of a PPR operation, stores an external repair address information in a register or a latch. In an SPPR mode, a predetermined address is stored in the register or the latch, and when the stored address is the same as the address received during an operation of a semiconductor memory device, an SPPR enable signal for accessing a redundant memory cell may be generated.

Therefore, the memory blocks on which a refresh operation is performed may be controlled by using the block selection signals in such a manner that the memory blocks share an SPPR enable signal and only a predetermined memory block may access the redundant cell region. When a block selection signal is enabled while the SPPR enable signal is enabled, the redundant cell region of a memory block corresponding to the block selection signal may be accessed.

As described above, refresh operations performed on memory blocks in parallel may overlap each other, and in the SPPR mode, the memory blocks may be controlled by sharing the SPPR enable signal. Therefore, among a plurality of memory blocks, a refresh operation may be properly performed on a memory block with a target address in the SPPR mode by selecting the redundant cell region thereof. However, the refresh operation may not be properly performed for the other memory blocks, since the memory blocks share the SPPR enable signal, and the normal cell region thereof is not selected.

SUMMARY

Embodiments of the present invention are directed to a semiconductor memory device suitable for controlling a refresh operation in a soft post-package repair (SPPR) mode.

In accordance with an embodiment of the present invention, a semiconductor memory device includes: a plurality of memory cell arrays each memory cell array including a first region, a second region, and a third region in the second region; and a repair controller suitable for storing a first repair address information, generating a first mode enable signal for accessing the third region by comparing the first repair address information with a row address during a first mode for a repair operation, and disabling the first mode enable signal in response to a refresh command regardless of a result of the comparing the first repair address information with the row address.

The repair controller may include: a first address latch unit that stores the first repair address information in response to a first mode latch enable signal and the row address during the first mode; and a repair enable signal generation unit that enables the first mode enable signal based on whether the first repair address information stored in the first address latch unit is the same as the row address and disables the first mode enable signal in response to the refresh command.

The semiconductor memory device may further include: a refresh operation controller that generates a refresh address for performing a refresh operation and generates a memory selection signal for selecting a memory cell array among the plurality of the memory cell arrays, in response to the refresh command; and a repair fuse that generates a first selection signal or a second selection signal by comparing a second repair address information with the row address in response to the first mode enable signal.

The refresh operation controller may include: a refresh address generation unit that generates a first refresh address corresponding to the first region and the second region in response to the refresh command, and generates a second refresh address corresponding to the third region and a first mode flag signal in response to the first refresh address; an address selection unit that selects the first and second refresh addresses or an external input address and outputs the selected address as the row address, in response to the refresh command; and a memory selection signal generation unit that generates the memory selection signal for selecting a predetermined memory cell array among the plurality of the memory cell arrays in response to the refresh command and the row address.

When the refresh command is enabled, the memory selection signal generation unit simultaneously may enable memory selection signals that correspond to the plurality of the memory cell arrays, or enables the memory selection signals with a predetermined temporal interval from each other.

The refresh address generation unit may include: a plurality of counters that generate a plurality of refresh addresses by counting the refresh command; and a counter reset controller that generates a first reset signal and a second reset signal for initializing the plurality of the counters in response to the plurality of the refresh addresses and an external reset signal, wherein the counter reset controller enables the first mode flag signal and the second reset signal in response to a last refresh address among the plurality of the refresh addresses.

The second reset signal may be an input signal of one or more counters among the plurality of the counters; and the first reset signal is an input signal of the other counters except the one or more counters among the plurality of the counters.

The repair fuse may include: a second address latch unit that latches the second repair address information during the first mode and a second mode; and a comparison unit that enables the first selection signal or the second selection signal based on whether the second repair address information is the same as the row address in response to the first mode enable signal and the first mode flag signal.

The comparison unit may enable the second selection signal when the first mode enable signal is enabled.

The comparison unit may enable the second selection signal when the first mode flag signal is enabled.

The comparison unit may enable the first selection signal or the second selection signal based on whether the second repair address information is the same as the row address or not during the second mode.

The first mode may be a repair operation mode after packaging, and the second mode is a normal operation mode.

The first region may be a normal memory cell region; and the second region may be a redundant cell region; and the third region may be a soft post-package repair (SPPR) region included in the redundant cell region that is accessed during the first mode.

The repair controller may compare the first repair address Information with the entire bits of the row address including a most significant bit.

The comparison unit may compare the second repair address information with remaining bits of the row address excluding a most significant bit.

In accordance with another embodiment of the present invention, a semiconductor memory device includes: a plurality of memory cell arrays each including a normal cell region, a redundant cell region for repairing a defective memory cell of the normal cell region, and a soft post-package repair (SPPR) region that is accessed during a first mode for a post-package repair operation in the redundant cell region; a repair controller that stores a first repair address information and generates a first mode enable signal for accessing to the SPPR region by comparing the first repair address information with a row address, during the first mode; a refresh operation controller that generates a refresh address for performing a refresh operation and a memory selection signal for selecting a memory cell array among the plurality of the memory cell arrays in response to a refresh command during a second mode; and a repair fuse that generates a first selection signal or a second selection signal by comparing a second repair address information with the row address in response to the first mode enable signal, wherein the repair controller disables the first mode enable signal in response to the refresh command regardless of a result of the comparing the first repair address information with the row address.

The repair controller may include: an SPPR address latch unit that stores the first repair address information in response to a first mode latch enable signal and the row address during the first mode; and an SPPR enable signal generation unit that enables the first mode enable signal based on whether the first repair address information is the same as the row address and disables the first mode enable signal in response to the refresh command.

The refresh operation controller may include: a refresh address generation unit that generates first refresh addresses corresponding to the normal cell region and the redundant cell region in response to the refresh command, and generates a second refresh address corresponding to the SPPR region and a first mode flag signal in response to the first refresh addresses; an address selection unit that selects the first and second refresh address or an external input address and outputs the selected address as the row address in response to the refresh command; and a memory selection signal generation unit that generates the memory selection signal for selecting a predetermined memory cell array among the plurality of the memory cell arrays in response to the refresh command and the row address.

The refresh address generation unit may include: a plurality of counters that generate a plurality of refresh addresses by counting the refresh command; and a counter reset controller that generates a first reset signal and a second reset signal for initializing the plurality of the counters in response to the plurality of refresh addresses and an external reset signal, wherein the counter reset controller enables the first mode flag signal and the second reset signal in response to a last refresh address among the plurality of the refresh addresses.

The repair fuse may include: a repair address latch unit that latches the second repair address information during the first mode or a second mode, which is a normal operation mode; and a comparison unit that enables the first selection signal or the second selection signal based on whether the second repair address information is the same as the row address in response to the first mode enable signal and the first mode flag signal.

BRIEF DESCRIPTION OF THE DRAWINGS

The above and other features and advantages of the present invention will become more apparent to those of ordinary skill in the art to which this invention belongs by describing in detail embodiments thereof with reference to the attached drawings in which.

DETAILED DESCRIPTION

Figure 1:
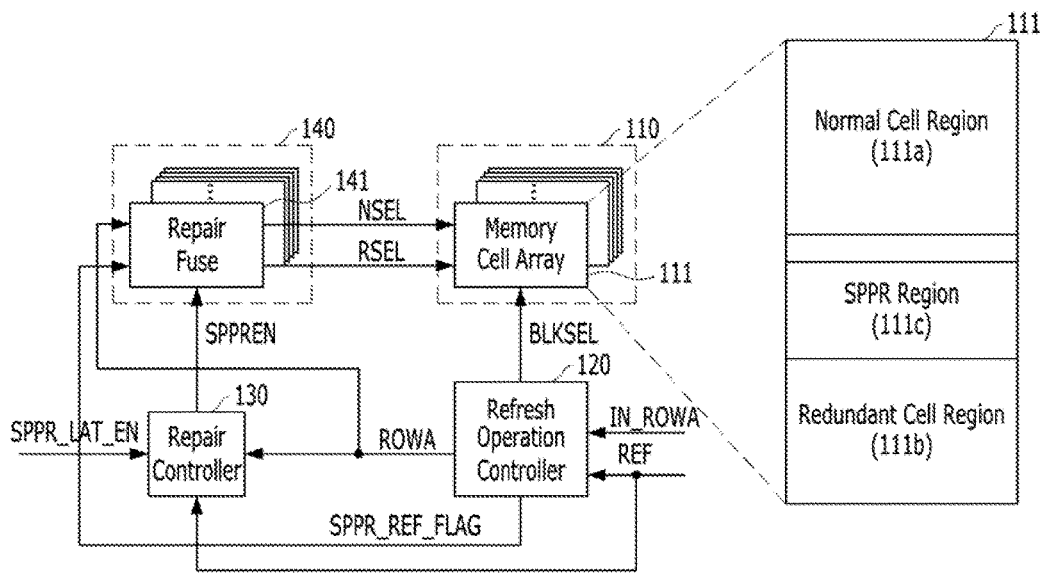
FIG. 1 is a simplified schematic diagram illustrating a semiconductor memory device, according to an embodiment of the present invention.

Embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art to which this invention belongs. Throughout the disclosure, like reference numerals refer to like parts throughout the various figures and embodiments of the present invention.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises," "comprising," "includes," and "including" when used in this specification, indicate the presence of stated features, and do not preclude the presence or addition of one or more other features. As used herein, the term "and/or" indicates any and all combinations of one or more of the associated listed items.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

Referring now to FIG. 1 a semiconductor memory device is provided according to an embodiment of the present invention. The semiconductor memory device may include a plurality of memory cell arrays 110, a refresh operation controller 120, a repair controller 130, and a plurality of repair fuses 140. Each of the memory cell arrays 110 may include a normal cell region and a redundant cell region. Herein, one memory cell array 111 among the memory cell arrays 110 is representatively described. The memory cell array 111 may include a first region including a normal cell region 111a and a second region including a redundant cell region 111b. A portion of the redundant cell region 111b may be reserved as a third region including an SPPR region 111c which is to be used during a first mode. The first mode may be a soft post-package repair (SPPR) mode. The SPPR mode means a mode in which an external repair address information is stored in a register or a latch in the middle of a post-package repair (PPR) operation, which is a repair operation performed in the stage of package.

In an embodiment, a portion of the redundant cell region 111b may be fixed as the SPPR region 111c. In another embodiment, it may be flexibly decided how large the SPPR region 111c may be through an internal control. Generally, each bank group is limited to a one-time repair operation during the SPPR mode. Thus, a small quantity of a region may be predetermined and used for a repair operation during the SPPR mode. In other words, a predetermined region of the redundant cell region 111b may be arbitrarily reserved as the SPPR region 111c.

The refresh operation controller 120 may receive a refresh command REF inputted from the exterior of the semiconductor memory device and generate a row address ROWA. The row address ROWA may be a refresh address for a refresh operation when the refresh command REF is enabled. When the refresh command REF is disabled, the row address ROWA may be an external input address IN_ROWA for other operations that is not a refresh operation.

The refresh operation controller 120 may generate a plurality of block selection signals BLKSEL for selecting the memory cell arrays 110, respectively, in response to the refresh command REF. The refresh operation controller 120 may enable all the block selection signals BLKSEL to enable the memory cell arrays 110 in parallel, when the refresh command REF is enabled. When the refresh command REF is disabled, in other words, when the semiconductor memory device performs an operation other than a refresh operation, the refresh operation controller 120 may enable a corresponding block selection signal for selecting a particular memory cell array among the memory cell arrays 110.

The refresh operation controller 120 may perform a refresh operation on the normal cell region 111a and a part of the redundant cell region 111b used for a repair operation in response to the refresh command REF. After the refresh operation on the normal cell region 111a and the part of the redundant cell region 111b is finished, the refresh operation controller 120 may perform a refresh operation on the SPPR region 111c.

The repair controller 130 may compare the row address ROWA with a repair address (not shown) that is stored in the repair controller 130 and generate an SPPR enable signal SPPREN in response to an SPPR latch enable signal SPPR_LAT_EN during the SPPR mode. Herein, the SPPR mode may be caused by a mode register set (MRS).

The repair controller 130 may disable the SPPR enable signal SPPREN in response to the refresh command REF during a refresh operation. The refresh operation may be operation of a second mode.

The repair fuses 140 may compare the row address ROWA with the repair address (not shown) that is stored in the repair fuses 140 and generate a normal cell selection signal NSEL or a redundant cell selection signal RSEL in response to the SPPR enable signal SPPREN. Herein, the normal cell selection signal NSEL may be a signal for enabling the normal cell region 111a, and the redundant cell selection signal RSEL may be a signal for enabling the redundant cell region 111b.

Hereafter, a method for operating the semiconductor memory device having the above structure is described.

First of all, a refresh operation is described.

The refresh operation controller 120 may generate a refresh address as the row address ROWA in response to a refresh command REF inputted from the exterior of the semiconductor memory device, e.g., a device such as a host that is external to the semiconductor memory device. The refresh operation controller 120 may enable all the block selection signals BLKSEL to perform a refresh operation on the memory cell arrays 110 in parallel. All the memory cell arrays 110 may perform the refresh operation at the same time. Alternatively, all the memory cell arrays 110 may perform the refresh operation sequentially with a predetermined temporal interval between them. When a corresponding normal cell selection signal NSEL is enabled to a logic high level H, the normal cell region of each of the memory cell arrays 110 may be enabled and perform a refresh operation. When a corresponding redundant cell selection signal RSEL is enabled to a logic high level H, the redundant cell region of each of the memory cell arrays 110 may be selected and perform a refresh operation.

The normal cell selection signal NSEL may be enabled when the row address ROWA is not the same as a repair address stored inside a repair fuse 141. The redundant cell selection signal RSEL may be enabled when the row address ROWA is the same as the repair address stored inside the repair fuse 141.

Also, after a first memory cell array 111 performs a refresh operation on the normal cell region 111a and the redundant cell region 111b corresponding to the repair address in response to the refresh command REF, the first memory cell array 111 may perform a refresh operation on the SPPR region 111c when the next refresh command REF is inputted.

Therefore, the refresh operation may be performed on the SPPR region 111c after the refresh operation has been performed on both normal cell region 111a and the redundant cell region 111b corresponding to the repair address. This will be described later with reference to FIGS. 2 and 3.

Subsequently, an operation in the SPPR mode is described.

The semiconductor memory device may enter the SPPR mode by a mode register set (MRS) included therein upon receipt of an SPPR command inputted from the exterior of the semiconductor memory device. When the SPPR mode begins, the repair controller 130 compares the row address ROWA with the repair address stored inside in response to an SPPR latch enable signal SPPR_LAT_EN. When the row address ROWA is the same as the repair address, the repair controller 130 may enable the SPPR enable signal SPPREN to a logic high level H.

Subsequently, a memory cell array enabled based on the block selection signal BLKSEL among the memory cell arrays 110 may be accessed. For example, the SPPR region 111c of the redundant cell region 111b in the first memory cell array 111 may be accessed.

Meanwhile, when a refresh operation is performed during the SPPR mode and the refresh command REF is enabled, the SPPR enable signal SPPREN may be disabled.

Figure 2:
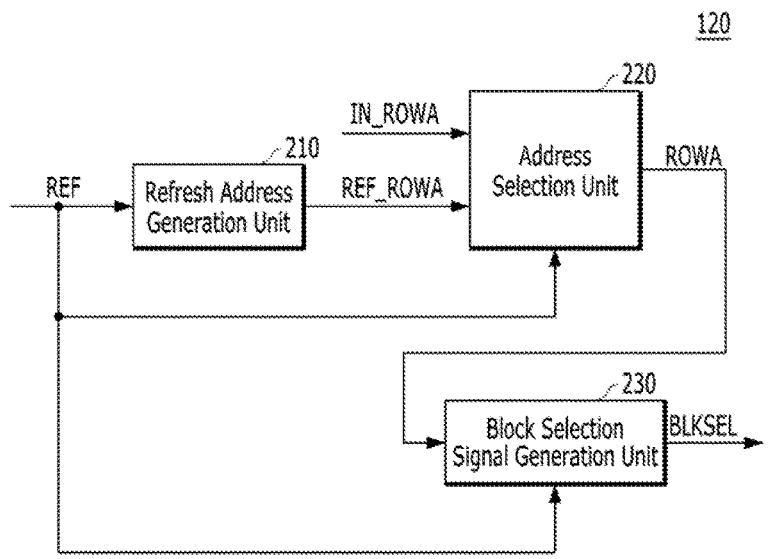
FIG. 2 is a simplified schematic diagram Illustrating a configuration example of a refresh operation controller shown in FIG. 1.

FIG. 2 illustrates an example configuration of the refresh operation controller 120 shown in FIG. 1.

Referring to FIG. 2, the refresh operation controller 120 may include a refresh address generation unit 210, an address selection unit 220, and a block selection signal generation unit 230.

The refresh address generation unit 210 may generate a refresh address REF_ROWA in response to the refresh command REF. The refresh address generation unit 210 may count the refresh command REF and generate the refresh address REF_ROWA on the normal cell region 111a and the redundant cell region 111b used for a repair operation. The refresh address generation unit 210 may generate the refresh address REF_ROWA in the SPPR region 111c after the refresh address REF_ROWA for the last row of the normal cell region 111a is generated.

The address selection unit 220 may output the external input address IN_ROWA or the refresh address REF_ROWA as the row address ROWA in response to the refresh command REF. Herein, the external input address IN_ROWA may be a row address inputted from the exterior of the semiconductor memory device when an operation other than a refresh operation is performed.

The block selection signal generation unit 230 may generate a block selection signal BLKSEL in response to the refresh command REF and the row address ROWA. Herein, the block selection signal BLKSEL may be generated for each of the memory cell arrays 110. When the refresh command REF is enabled, a plurality of block selection signals BLKSEL may be all enabled. During other operations, i.e., operations other than a refresh operation, only a corresponding block selection signal BLKSEL may be enabled to select a predetermined memory cell array.

Figure 3:
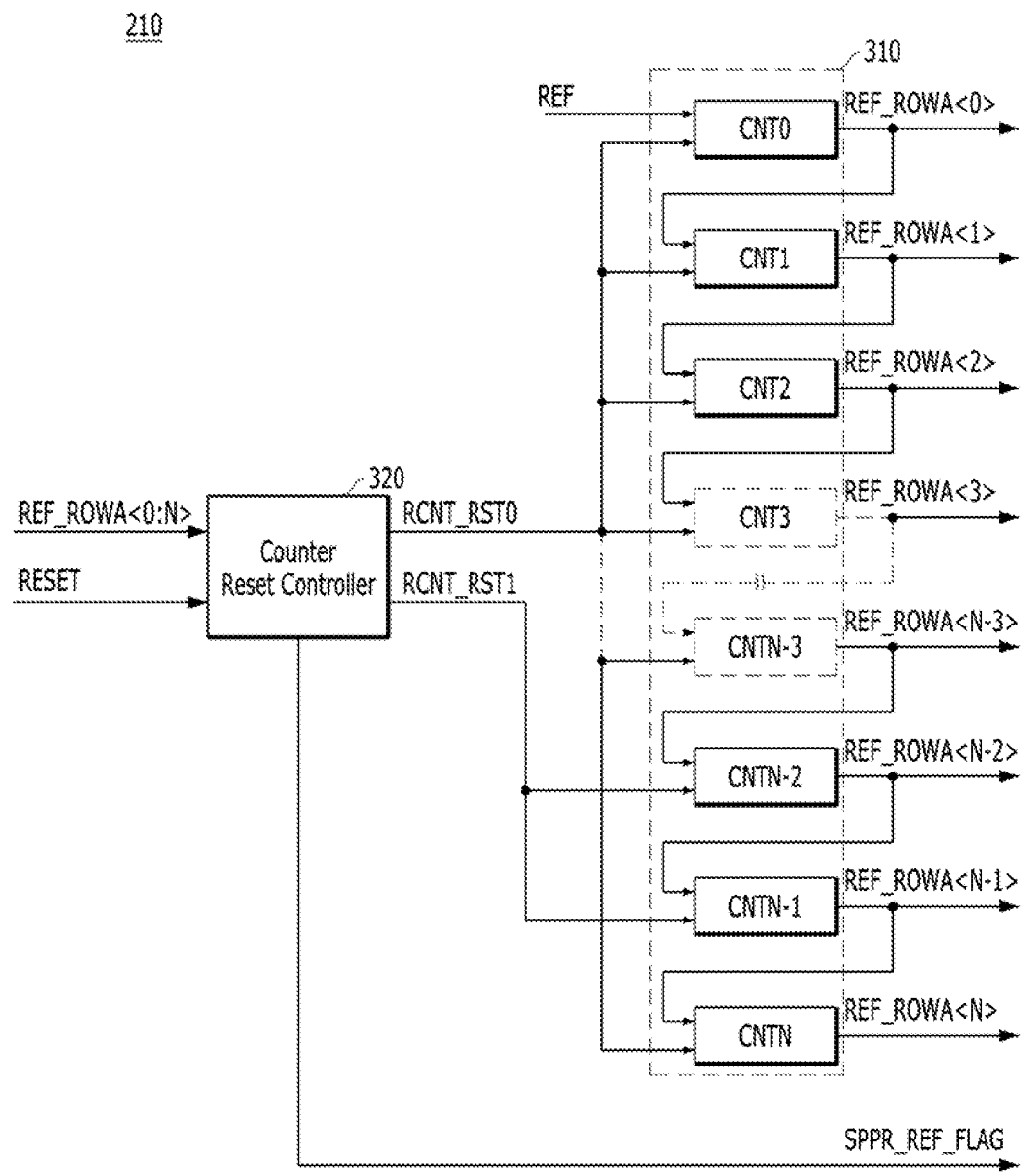
FIG. 3 is a simplified schematic diagram illustrating a configuration example of a refresh address generation unit shown in FIG. 2.

FIG. 3 illustrates a configuration example of the refresh address generation unit 210 shown in FIG. 2.

Referring to FIG. 3, the refresh address generation unit 210 may include a plurality of counters 310 and a counter reset controller 320.

Among the counters 310, a first counter CNT0 may count the refresh command REF and generate a first refresh address REF_ROWA<0>. A second counter CNT1 may count the first refresh address REF_ROWA<0>, which is an output signal of the first counter CNT0, and generate a second refresh address REF_ROWA<1>. Likewise an $n^{th}$ counter CNTN may count the output signal of the previous $(n-1)^{th}$ counter CNTN-1 and generate the refresh address REF_ROWA<N>.

The counter reset controller 320 may generate a first reset signal RCNT_RST0 and a second reset signal RCNT_RST1 in response to the refresh address REF_ROWA<0:N> and an external reset signal RESET, and generate an SPPR refresh flag signal SPPR_REF_FLAG in response to the value of the refresh address REF_ROWA<0:N>.

Hereafter, an operation of the refresh address generation unit 210 is described.

When a refresh operation is performed in response to the refresh command REF, the refresh address generation unit 210 may generate the refresh address REF_ROWA<0:N> corresponding to the normal cell region 111a and the redundant cell region 111b used for a repair operation to perform a refresh operation on the normal cell region 111a and the redundant cell region 111b used for a repair operation.

Herein, the SPPR refresh flag signal SPPR_REF_FLAG may be in a logic low level, until all the memory cells of the normal cell region 111a of the first memory cell array 111 are refreshed, in other words, until the refresh address REF_ROWA<0:N> corresponding to the last memory cell of the normal cell region 111a is enabled.

The counter reset controller 320 may enable a second reset signal RCNT_RST1 and enable the SPPR refresh flag signal SPPR_REF_FLAG to a logic high level, when the last refresh address REF_ROWA<0:N> is inputted while the SPPR refresh flag signal SPPR_REF_FLAG is in a logic low level. The second reset signal RCNT_RST1 may not be inputted to all counters 310 but inputted to predetermined counters, e.g., a (N-2)th counter CNTN-2 and a (N-1)th counter CNTN-1, and the counting operation of the (N-2)th and (N-1)th counters CNTN-2 and CNTN-1 may be reset. The reset operation is performed to generate a refresh address REF_ROWA<0:N> corresponding to the SPPR region 111c by resetting a predetermined counter to perform a refresh operation in the SPPR region 111c, after all memory cells corresponding to the normal cell region 111a and the redundant cell region 111b used for a repair operation are refreshed.

When the last refresh address REF_ROWA<0:N> is inputted while the SPPR refresh flag signal SPPR_REF_FLAG is in a logic high level, the counter reset controller 320 enables the first and second reset signals RCNT_RST0 and RCNT_RST1 in the form of pulse, and thereby all the counters 310 are reset and the refresh address REF_ROWA<0:N> may be generated again to perform a refresh operation from the beginning.

Meanwhile, the SPPR refresh flag signal SPPR_REF_FLAG may be inputted to the repair fuses 140 shown in FIG. 1, which enables a normal cell selection signal NSEL or a redundant cell selection signal RSEL, and thereby the first memory cell array 111 may perform a refresh operation on the memory cells corresponding to the corresponding region.

Figure 4:
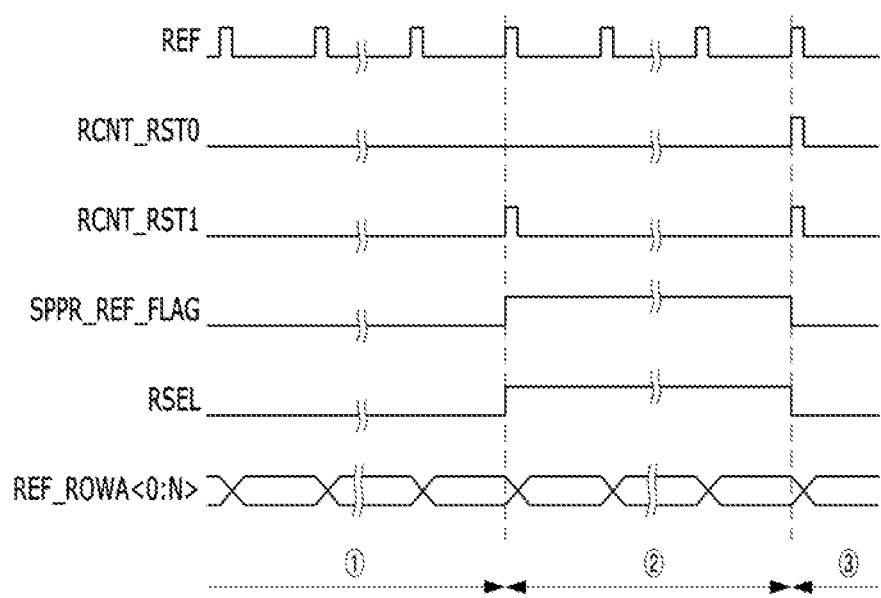
FIG. 4 is a timing diagram illustrating an operation of the refresh address generation unit shown in FIG. 3.

FIG. 4 is a timing diagram illustrating an operation of the refresh address generation unit 210 shown in FIG. 3.

Referring to FIG. 4, when a refresh command REF is Inputted from the exterior of the semiconductor memory device, the counters 310 may generate the refresh address REF_ROWA<0:N> to perform a refresh operation. The refresh address REF_ROWA<0:N> may correspond to addresses of the normal cell region 111a and the redundant cell region 111b used for a repair operation. The SPPR refresh flag signal SPPR_REF_FLAG may be enabled after the last address among the addresses of the normal cell region 111a and the redundant cell region 111b used for a repair operation is generated.

While the SPPR refresh flag signal SPPR_REF_FLAG is enabled, the second reset signal RCNT_RST1 is enabled in the form of pulse and thereby the second reset signal RCNT_RST1 is inputted to a predetermined counter among the multiple counters 310. The counter receiving the second reset signal RCNT_RST1 gets initialized and then performs a counting operation again. As a result, the refresh address REF_ROWA<0:N> may be generated to correspond to addresses of the SPPR region 111c. Herein, as the SPPR refresh flag signal SPPR_REF_FLAG is enabled, the redundant cell selection signal RSEL is enabled together. Thus, the first memory cell array 111 may perform a refresh operation on the memory cells of the SPPR region 111c.

When the last address among the addresses of the SPPR region 111c is generated while the SPPR refresh flag signal SPPR_REF_FLAG is enabled, the first and second reset signals RCNT_RST0 and RCNT_RST1 are enabled in the form of pulse, which initializes all the counters 310 and makes the refresh operation performed from the beginning.

To sum up, when a refresh operation is performed by receiving a refresh command REF, the refresh operation may be performed on the normal cell region 111a and the redundant cell region 111b used for a repair operation except for the SPPR region 111c while the SPPR refresh flag signal SPPR_REF_FLAG is disabled to a logic low level (first time period ①). While the SPPR refresh flag signal SPPR_REF_FLAG is enabled to a logic high level (second time period ②), the refresh operation may be performed on the SPPR region 111c. Subsequently, when the SPPR refresh flag signal SPPR_REF_FLAG is disabled back to the logic low level (third time period ③), the refresh operation may be repeated from the beginning on the normal cell region 111a and the redundant cell region 111b used for a repair operation.

Figure 5:
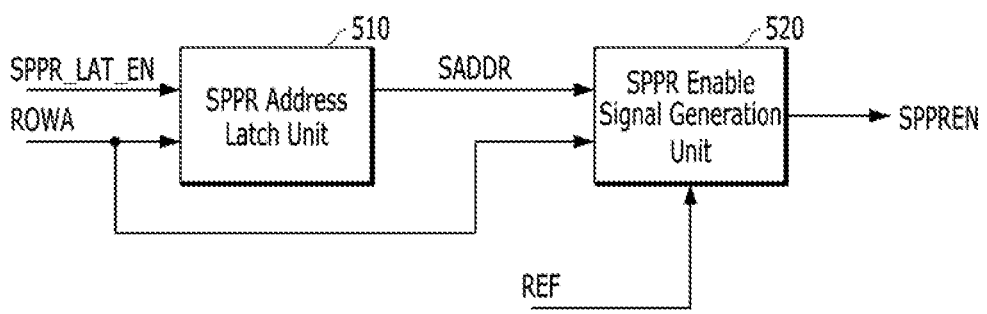
FIG. 5 is a simplified schematic diagram illustrating a configuration example of a repair controller shown in FIG. 1.

FIG. 5 illustrates a configuration example of the repair controller 130 shown in FIG. 1.

Referring to FIG. 5, the repair controller 130 may include an SPPR address latch unit 510 and an SPPR enable signal generation unit 520.

The SPPR address latch unit 510 may receive the row address ROWA in response to the SPPR latch enable signal SPPR_LAT_EN and latch a repair address SADDR of a memory cell that is to be repaired during the SPPR mode. Herein, the SPPR latch enable signal SPPR_LAT_EN may be enabled by the mode register set (MRS) during the SPPR mode.

The repair address SADDR latched in the SPPR address latch unit 510 may be used as an input signal of the SPPR enable signal generation unit 520.

The SPPR enable signal generation unit 520 may generate the SPPR enable signal SPPREN by comparing the repair address SADDR with the row address ROWA. Herein, the SPPR enable signal generation unit 520 compares the repair address SADDR with the row address ROWA, and when the two addresses are the same, the SPPR enable signal generation unit 520 may enable the SPPR enable signal SPPREN. When the two addresses are not the same, the SPPR enable signal generation unit 520 may disable the SPPR enable signal SPPREN.

The SPPR enable signal generation unit 520 may control whether to enable the SPPR enable signal SPPREN or not in response to the refresh command REF. In other words, even though the repair address SADDR and the row address ROWA are the same, the SPPR enable signal generation unit 520 may disable the SPPR enable signal SPPREN when the refresh command REF is enabled.

In this way, the refresh operation may be prevented from overlapping with the SPPR operation. The refresh operation may thus be performed properly on the normal cell region 111*a* and the redundant cell region 111*b* used for a repair operation.

Figure 6:
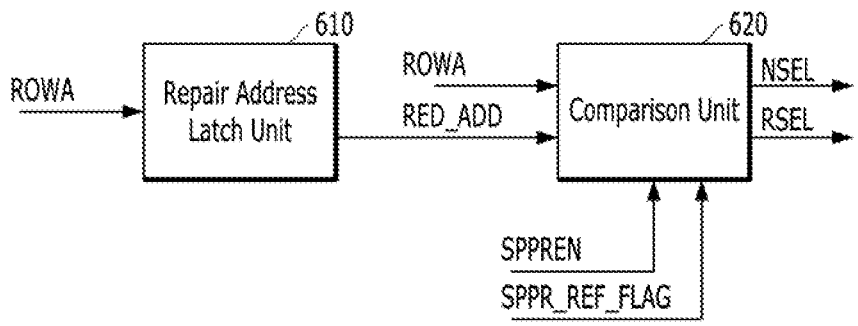
FIG. 6 is a simplified schematic diagram illustrating a configuration example of a repair fuse shown in FIG. 1.

FIG. 6 illustrates a configuration example of the repair fuse 141 shown in FIG. 1.

Referring to FIG. 6, the repair fuse 141 may include a repair address latch unit 610 and a comparison unit 620.

The repair address latch unit 610 may latch a repair target address RED_ADD among the row addresses ROWA. Herein, a defective address information (not shown) corresponding to the repair target address RED_ADD may be inputted from the exterior of the semiconductor memory device.

The comparison unit 620 may compare the repair target address RED_ADD with the row address ROWA and selectively output the normal cell selection signal NSEL or the redundant cell selection signal RSEL.

When the SPPR enable signal SPPREN is disabled and the repair target address RED_ADD is not the same as the row address ROWA, the comparison unit 620 may enable the normal cell selection signal NSEL. When the SPPR enable signal SPPREN is disabled and the repair target address RED_ADD is the same as the row address ROWA, the comparison unit 620 may enable the redundant cell selection signal RSEL. When the normal cell selection signal NSEL is enabled, a memory cell corresponding to the row address ROWA among the memory cells of the normal cell region 111*a* may be accessed. When the redundant cell selection signal RSEL is enabled, a memory cell corresponding to the repair target address RED_ADD among the memory cells of the redundant cell region 111*b* may be accessed.

Also, when the SPPR enable signal SPPREN is enabled, it means that the repair target address RED_ADD is the same as the row address ROWA. Thus, the comparison unit 620 may enable the redundant cell selection signal RSEL, and the SPPR region of a memory cell array enabled by a memory selection signal BLKSEL among the multiple memory cell arrays 110 may be accessed.

Meanwhile, the SPPR enable signal generation unit 520 of FIG. 5 and the comparison unit 620 of FIG. 6 perform the same operation of comparing the repair (target) address SADDR(RED_ADD) with the row address ROWA and controlling the output signal based on the comparison result. However, the SPPR enable signal generation unit 520 of FIG. 5 performs the comparison to the uppermost address to select one memory cell array among the multiple memory cell arrays 110, whereas the comparison unit 620 of FIG. 6 does not perform the comparison to the uppermost address to select one memory cell array because it generates and transfers the normal cell selection signal NSEL or the redundant cell selection signal RSEL for all the memory cell arrays 110 in common.

To sum up, the semiconductor memory device in accordance with an embodiment of the present invention may perform a refresh operation in parallel on the memory cell arrays 110. During an SPPR mode, the semiconductor memory device may perform an SPPR operation on a corresponding memory cell array 111 among the memory cell arrays 110. Therefore, the refresh operation may be prevented from overlapping with the SPPR operation, and properly performed on the normal cell region 111*a* and the redundant cell region 111*b* used for a repair operation.

According to an embodiment of the present invention an additional refresh operation may be performed specifically on the SPPR region 111*c* among the redundant cell region 111*b*. However, in another embodiment, the refresh operation may be performed on the entire redundant cell region without specifying a particular region, thereby further simplifying the refresh address generation unit 210 controlling the refresh operation.

According to the embodiments of the present invention, a semiconductor memory device performs an improved refresh operation by controlling the refresh operation in a soft post-package repair (SPPR) mode.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a plurality of memory cell arrays each memory cell array including a first region, a second region, and a third region in the second region;
a repair controller suitable for storing a first repair address information, generating a first mode enable signal for accessing the third region by comparing the first repair address information with a row address during a first mode for a repair operation, and disabling the first mode enable signal in response to a refresh command regardless of a result of the comparing the first repair address information with the row address; and
a refresh operation controller suitable for generating a refresh address for performing a refresh operation in response to the refresh command, wherein a first refresh address corresponding to the first region and the second region is generated in response to the refresh command, and a second refresh address corresponding to the third region is generated in response to the first refresh address.

2. The semiconductor memory device of claim 1, wherein the repair controller includes:
a first address latch unit that stores the first repair address information in response to a first mode latch enable signal and the row address during the first mode; and
a repair enable signal generation unit that enables the first mode enable signal based on whether the first repair address information stored in the first address latch unit is the same as the row address and disables the first mode enable signal in response to the refresh command.

3. The semiconductor memory device of claim 1, further comprising:
a repair fuse that generates a first selection signal or a second selection signal by comparing a second repair address information with the row address in response to the first mode enable signal,
wherein the refresh operation controller generates a memory selection signal for selecting a memory cell array among the plurality of the memory cell arrays, in response to the refresh command.

4. The semiconductor memory device of claim 3, wherein the refresh operation controller includes:
a refresh address generation unit that generates the first refresh address corresponding to the first region and the second region in response to the refresh command, and generates the second refresh address corresponding to the third region and a first mode flag signal in response to the first refresh address;
an address selection unit that selects the first and second refresh addresses or an external input address and outputs the selected address as the row address, in response to the refresh command; and
a memory selection signal generation unit that generates the memory selection signal for selecting a predetermined memory cell array among the plurality of the memory cell arrays in response to the refresh command and the row address.

5. The semiconductor memory device of claim 4, wherein when the refresh command is enabled, the memory selection signal generation unit simultaneously enables memory selection signals that correspond to the plurality of the memory cell arrays, or enables the memory selection signals with a predetermined temporal interval from each other.

6. The semiconductor memory device of claim 4, wherein the refresh address generation unit includes:
a plurality of counters that generate a plurality of refresh addresses by counting the refresh command; and
a counter reset controller that generates a first reset signal and a second reset signal for initializing the plurality of the counters in response to the plurality of the refresh addresses and an external reset signal,
wherein the counter reset controller enables the first mode flag signal and the second reset signal in response to a last refresh address among the plurality of the refresh addresses.

7. The semiconductor memory device of claim 6, wherein:
the second reset signal is an input signal of one or more counters among the plurality of the counters; and
the first reset signal is an input signal of the other counters except the one or more counters among the plurality of the counters.

8. The semiconductor memory device of claim 4, wherein the repair fuse includes:
a second address latch unit that latches the second repair address information during the first mode and a second mode; and
a comparison unit that enables the first selection signal or the second selection signal based on whether the second repair address information is the same as the row address in response to the first mode enable signal and the first mode flag signal.

9. The semiconductor memory device of claim 8, wherein the comparison unit enables the second selection signal when the first mode enable signal is enabled.

10. The semiconductor memory device of claim 8, wherein the comparison unit enables the second selection signal when the first mode flag signal is enabled.

11. The semiconductor memory device of claim 8, wherein the comparison unit enables the first selection signal or the second selection signal based on whether the second repair address information is the same as the row address or not during the second mode.

12. The semiconductor memory device of claim 8, wherein the first mode is a repair operation mode after packaging, and the second mode is a normal operation mode.

13. The semiconductor memory device of claim 1, wherein:
the first region is a normal memory cell region; and
the second region is a redundant cell region; and
the third region is a soft post-package repair (SPPR) region included in the redundant cell region that is accessed during the first mode.

14. The semiconductor memory device of claim 2, wherein the repair controller compares the first repair address information with the entire bits of the row address including a most significant bit.

15. The semiconductor memory device of claim 8, wherein the comparison unit compares the second repair address information with remaining bits of the row address excluding a most significant bit.

16. A semiconductor memory device, comprising:
a plurality of memory cell arrays each including a normal cell region, a redundant cell region for repairing a defective memory cell of the normal cell region, and a soft post-package repair (SPPR) region that is accessed during a first mode for a post-package repair operation in the redundant cell region;
a repair controller that stores a first repair address information and generates a first mode enable signal for accessing to the SPPR region by comparing the first repair address information with a row address, during the first mode;
a refresh operation controller that generates a refresh address for performing a refresh operation and a memory selection signal for selecting a memory cell array among the plurality of the memory cell arrays in response to a refresh command during a second mode; and
a repair fuse that generates a first selection signal or a second selection signal by comparing a second repair address information with the row address in response to the first mode enable signal,
wherein the repair controller disables the first mode enable signal in response to the refresh command regardless of a result of the comparing the first repair address information with the row address,
wherein the refresh operation controller generates first refresh addresses corresponding to the normal cell region and the redundant cell region in response to the refresh command, and generates a second refresh address corresponding to the SPPR region in response to the first refresh addresses.

17. The semiconductor memory device of claim 16, wherein the repair controller includes:
an SPPR address latch unit that stores the first repair address information in response to a first mode latch enable signal and the row address during the first mode; and
an SPPR enable signal generation unit that enables the first mode enable signal based on whether the first repair address information is the same as the row address and disables the first mode enable signal in response to the refresh command.

18. The semiconductor memory device of claim 16, wherein the refresh operation controller includes:

a refresh address generation unit that generates the first refresh addresses corresponding to the normal cell region and the redundant cell region in response to the refresh command, and generates the second refresh address corresponding to the SPPR region and a first mode flag signal in response to the first refresh addresses;

an address selection unit that selects the first and second refresh address or an external input address and outputs the selected address as the row address in response to the refresh command; and a memory selection signal generation unit that generates the memory selection signal for selecting a predetermined memory cell array among the plurality of the memory cell arrays in response to the refresh command and the row address.

19. The semiconductor memory device of claim 18, wherein the refresh address generation unit includes:

a plurality of counters that generate a plurality of refresh addresses by counting the refresh command; and a counter reset controller that generates a first reset signal and a second reset signal for initializing the plurality of the counters in response to the plurality of refresh addresses and an external reset signal, wherein the counter reset controller enables the first mode flag signal and the second reset signal in response to a last refresh address among the plurality of the refresh addresses.

20. The semiconductor memory device of claim 18, wherein the repair fuse includes:

a repair address latch unit that latches the second repair address information during the first mode or a second mode, which is a normal operation mode; and a comparison unit that enables the first selection signal or the second selection signal based on whether the second repair address information is the same as the row address in response to the first mode enable signal and the first mode flag signal.

* * * * *